United States Patent [19]
van der Tol

[11] Patent Number: 5,574,808
[45] Date of Patent: Nov. 12, 1996

[54] OPTICAL SWITCHING DEVICE

[75] Inventor: Johannes J. G. M. van der Tol, Zoetermeer, Netherlands

[73] Assignee: Koninklijke PTT Nederland N.V., The Hague, Netherlands

[21] Appl. No.: 284,605

[22] PCT Filed: Feb. 17, 1993

[86] PCT No.: PCT/EP93/00370
§ 371 Date: Sep. 12, 1994
§ 102(e) Date: Sep. 12, 1994

[87] PCT Pub. No.: WO93/17363
PCT Pub. Date: Sep. 2, 1993

[30] Foreign Application Priority Data

Feb. 21, 1992 [NL] Netherlands ............ 9200328

[51] Int. Cl.⁶ .................................. G02B 6/35
[52] U.S. Cl. ................... 385/28; 385/16; 385/45
[58] Field of Search ................. 385/28, 14, 15, 385/23, 11, 50, 45, 16

[56] References Cited

U.S. PATENT DOCUMENTS

| | | | |
|---|---|---|---|
| 4,359,260 | 11/1982 | Reinhart et al. | 385/11 |
| 5,185,828 | 2/1993 | van der Tol | 385/28 |
| 5,285,507 | 2/1994 | Van der Tol | 385/11 |
| 5,325,221 | 6/1994 | Van der Tol | 385/28 X |

FOREIGN PATENT DOCUMENTS

| | | |
|---|---|---|
| 57-155518 | 9/1982 | Japan . |
| 59-49517 | 3/1984 | Japan . |
| 4-22904 | 1/1992 | Japan . |

OTHER PUBLICATIONS

Y. Shani et al; "Polarization Rotation in Asymmetric Periodic Loaded Rib Waveguides"; Sep. 9, 1991; pp. 1278–1280; Appl. Phys. Lett, vol. 59, No. 11.

K. Ishida et al; "InGaAsP/InP Optical Switches Using Carrier Induced Refractive Index Change"; Jan. 19, 1987; pp. 141–142; Appl. Phys. Lett., vol. 50, No. 3.

M. Schlak et al; "Tunable TE/TM–Mode Converter on (001)–InP–Substrate"; Jan. 1991; pp. 15–16; IEEE Photonics Technology Letters, vol. 3, No. 1.

*Primary Examiner*—Rodney B. Bovernick
*Assistant Examiner*—Phan T. H. Palmer
*Attorney, Agent, or Firm*—Frishauf, Holtz, Goodman, Langer & Chick

[57] ABSTRACT

An integrated optical switching device for switchably converting a fraction of a first guided mode signal into a second guided mode signal of different order is provided. Added to a passive mode converter (c) provided with a bimodal waveguide, in which the conversion can take place by a periodic coupling in coupling surfaces 1–N as a consequence of a specific geometry (f, g), are electrodes (10, 14) for switchably disrupting the coupling, as a consequence of which the conversion does or does not take place. Preferably, the optical switching device is constructed on semiconductor material and the modification is carried out by charge carrier injection. On/off and directional switches based on this are provided. As a result, the advantages of the present system are very good integrability, short length, no critical parameters in the manufacture, and operation at low control currents.

19 Claims, 2 Drawing Sheets

OPTICAL SWITCHING DEVICE

BACKGROUND OF THE INVENTION

1. Field of the Invention

The invention is in the field of integrated optical devices. More particularly it relates to an optical switching device for switching a light signal.

2. Prior Art

In a coherent optical local network, a subscriber is connected by means of a combined coherent optical transmitter/receiver. Such a combined transmitter/receiver is preferably constructed as an integrated device. In such a transmitter/receiver, a switch should be incorporated for closing the transmission channel in order to be able to adjust the transmitter without disrupting the network.

For such a switch, an isolation or extinction ratio is required of at least approximately 40 dB. Various types of switches, 1×2 or 2×2, are known, such as the directional coupler, the digital optical switch, or a Mach-Zehnder switch. These known switches generally have an isolation of 20 to 30 dB and do not therefore achieve the required isolation. It is true that the required isolation can be achieved by placing two or more such switches in series. This means, however, that the complexity and the integration space needed increases. Another switching possibility, which directly fits in with the use of semiconductor material, can be obtained by means of charge carrier injection. As a result of injecting free charge carriers into the semiconductor material over a certain length of a waveguide via an electrode, the absorption increases. In principle, any desired isolation could be obtained simply by making said length and/or the current of charge carriers large enough. An absorption switch of this type would, in addition, be very simple since it can be formed by a waveguide and an electrode placed lengthwise thereon. With the present state of the art of making contact, however, semiconductor materials, such as InP, do not withstand current densities greater than 20 kA/cm$^2$, which is equivalent to a length of not less than 1 cm for the desired 40 dB isolation. In view of the fact that the typical dimensions of a 'chip' of semiconductor material are at present between 1 and 2 cm, this is long.

Reference [1] discloses a directional coupler on semiconductor material, which directional coupler makes use, for the control thereof, of charge carrier injection over the length of the coupling section with the aid of an electrode placed centrally above the central coupling section. In this switch, too, the isolation or extension ratio is of the order of 20 dB.

In a bimodal waveguide, light signals can generally propagate, within a particular wavelength range, both in a zeroth-order guided mode and in a first-order guided mode. If said bimodal waveguide merges into a monomodal waveguide via a taper, only the zeroth-order mode component of the signal in the bimodal waveguide propagates further in the latter and the first-order guided mode component is scattered in the taper. If the bimodal waveguide debouches in an asymmetrical Y junction having a bimodal input guide and two monomodal output guides with different propagation constants, the two mode components are split, specifically in such a way that the zeroth-order guided mode component will couple out via the output guide having the highest propagation constant and the first-order guided mode component via the one having the lowest propagation constant and will propagate further therein in the zeroth-order mode of said guide. In both cases, the two signal components are therefore separated from one another in this process, one of the components being lost, however, in one case. Reference [2], which had not been laid open for inspection to the public in time, describes a passive integrated optical device which can be dimensioned in such a way that a well-defined signal fraction, up to 100%, of a zeroth-order guided mode is converted therewith in a wavelength-selective manner into a first-order guided mode in a bimodal waveguide. If such a converter is coupled at its output to a taper or an asymmetrical Y junction as indicated above and if the conversion of the signal fraction were also to be switchable between two states in which conversion does or does not take place, respectively, a switch would be produced for switching the signal fraction. If the taper is chosen as output section, an on/off switch is produced, while an asymmetrical Y junction produces a propagation direction switch. In view of the constituent components of such a switch, it may be expected that it can overcome the drawbacks mentioned above. In addition, a wavelength-selective multiplexer and demultiplexer described in reference [3], which had not been laid open for inspection to the public in time, could be of switchable construction. There is therefore a need for an optical device of a type similar to the mode converter which is described perse in reference [2] and in which the conversion is switchable.

SUMMARY OF THE INVENTION

The object of the invention is to provide for the need mentioned. For this purpose, an optical switching device is, according to the invention, characterised by a passive mode converter for converting a fraction of a first guided mode signal into a second guided mode signal by means of a periodic coupling between the first and second guided mode signals, the mode converter including a waveguide having in its longitudinal direction a periodic mode field structure, and means for switchably modifying the periodic mode field profile structure in the waveguide, which is constructed in an optical medium to which the means correspond for allowing switchably modifying. The invention is based on the insight that, in a channel-type waveguide, and more in particularly in a bimodal channel-type waveguide, the mode field profiles of a zeroth-order guided mode signal and a first-order guided mode signal are characteristically different and, on the basis of this, one of the profiles can be more strongly modified than the other.

In addition, an object of the invention is to provide an optical switch of the type indicated above which does have the required insulation but does not have the disadvantages mentioned.

It is pointed out that switchability also implies modulability, with the result that the various switching devices according to the invention can always also be used as intensity modulators.

The invention produces a switching device which is very readily integrable, preferably on semiconductor material such as InP, and which is much shorter, approximately 1 mm, but hardly any more complicated than an absorption switch of the type indicated above. The waveguide structure can be produced in a single etching step. There are no critical parameters in the manufacture. It requires control currents which are much lower than usual for absorption switches.

REFERENCES

[1] K. Ishida, et al. "InGaAsP/InP optical switches using carrier induced refractive index change", Appl. Phys. Lett. 50(3), 19 Jan. 1987, pp. 141, 142;

[2] EP-A-o513919 (by the Applicant; published Nov. 19, 1992) entitled: Mode converter;

[3] NL-9101532 (by the Applicant; not yet published) entitled: Golflengte selectieve multiplexer en demultiplexer [Wavelength-selective multiplexer and demultiplexer].

BRIEF DESCRIPTION OF THE DRAWING

The invention will be explained in greater detail by means of the description of a number of exemplary embodiments, reference being made to the drawings wherein.

DESCRIPTION OF PREFERRED EMBODIMENTS

Figure 1:
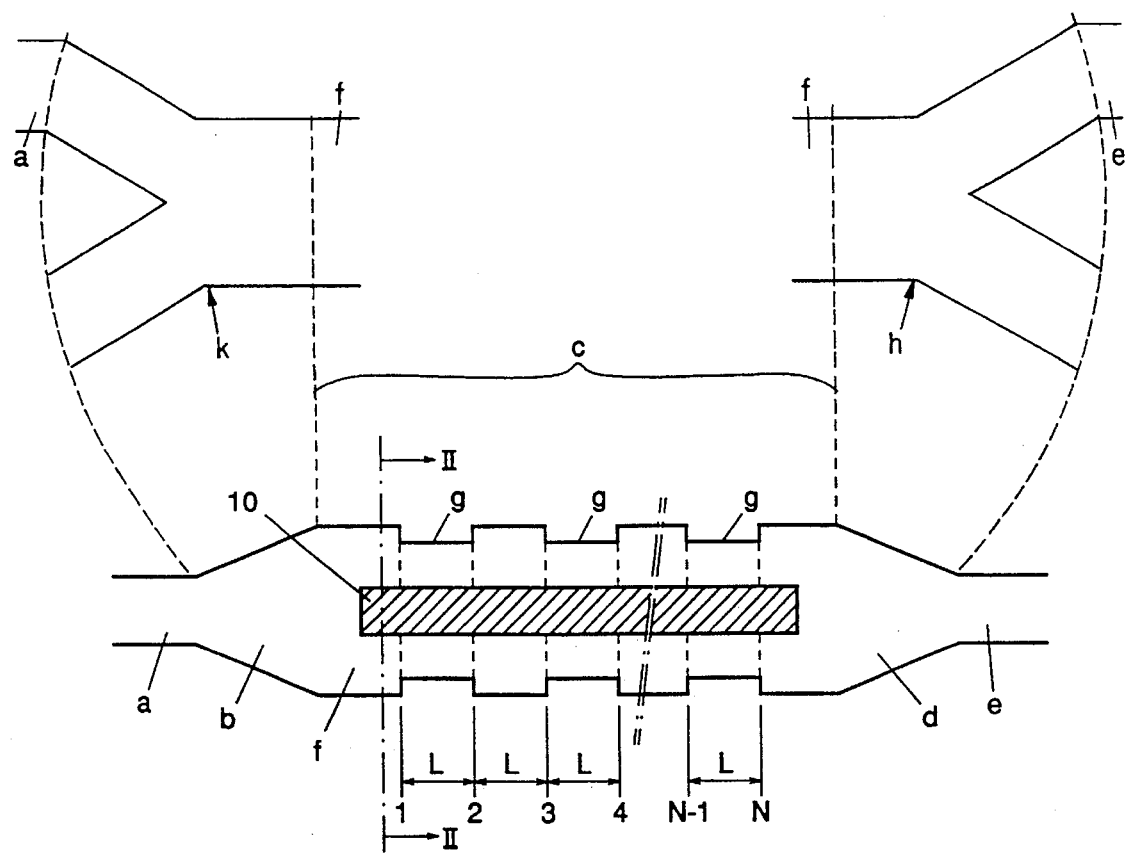
FIG. 1 shows diagrammatically an optical switching device according to the invention in a plan view.

Mode field profile of a light signal propagating in a channel-type waveguide is understood as meaning (the shape of) the electrical field distribution which a guided mode of the light signal has in the waveguide. Said profile depends not only on the geometry of the guide, called geometric structure, but also on the optical properties of the waveguide medium and its surroundings, called refractive index profile. The total structure of a waveguide, i.e. its geometrical structure and its refractive index profile, is called mode field profile structure. In a, e.g. bimodal, channel-type (optical) waveguide in a medium which is optionally isotropic, two propagation modes, viz. the fundamental or zeroth-order mode and the first-order mode, of each polarization are generally able to propagate. The mode field profiles which such a bimodal waveguide has for the two guided modes have a characteristic difference. Specifically, in the center of such a channel-type guide, the field strength associated with the first-order propagation mode is zero, but that of the zeroth-order propagation mode is, on the other hand, at a maximum. With a suitably chosen medium for the waveguide, this provides the possibility of modifying essentially only the propagation constant of one of the two guided modes in the waveguide, that is to say of the zeroth-order or the first-order mode, and consequently modifying the mode field profile of the bimodal guide for that guided mode, and not modifying, or modifying to a much smaller extent, that of, or for, the other guided mode. Since a geometrical structure, once chosen, of a waveguide has essentially been established, modifying the mode field profile should preferably occur by modifying of the refractive index profile. The invention applies this to a channel-type guide of a per se passive mode converter of types such as those described by reference [2], and more particularly indicated in TABLE 2 therein. Such a mode converter contains a central waveguide, which has a mode field profile structure, which varies periodically in its longitudinal direction. As a consequence in the waveguide a number of coupling surfaces are present on a mutual distance of half a period, the distance of a full period being called period length PL, whereby in the waveguide a periodic coupling is effected between the two guided modes, for which the converter has been dimensioned. With each pair of guided modes a specific propagation distance corresponds, called coupling length KL, over which coupling distance the two modes involved come into phase again. Should in the central waveguide of the passive mode converter a positive interfering coupling take place for converting a certain fraction of the one guided mode into the other guided mode, then the coupling length KL of the pair of guided modes involved should match with the period length PL. Modifying the mode field profile of mainly one of both guided modes in a manner as described above results in the coupling length KL between both the modes involved in the conversion being modified and therefore not matching necessarily any more with the period length PL. In that case the modes involved experience a mutual phase deviation in each coupling surface, as a consequence of which an insufficiently positive interfering coupling is established. The conversion then no longer completely takes place to the extent to which the coupling length and the number of coupling surfaces in the passive converter are matched, or it does not take place at all, all this being dependent on the extent of the modification. If the modification is switchable between two states, for example no modification and, on the other hand, modification, the conversion of a certain fraction of the one mode into the other is thereby switchable. The reverse effect is also possible. A particular mode converter may, as it were, be designed as critically detuned for the conversion of a particular fraction of one guided mode into another, with the result that the desired conversion only takes place with a suitably chosen degree of modification, while said conversion does not, on the other hand, take place without the modification. Just as for the mentioned passive mode converter, it is also true of such switchable mode converters that they can be produced using known integration technologies throughout, and on the basis of waveguide materials and structures used in such technologies. The waveguide materials are, however, subject in this connection to the limitation that they must have the possibility of the modification of the mode field profile structure indicated above, i.e. of the refractive index profile of the waveguide. Theoretically, the desired modification of the light propagation in the bimodal waveguide can be achieved by means of electro-optical, thermo-optical, opto-optical etc. effects, given suitable choice of the material of the waveguide or of its surroundings and the associated modifying means. Since the modification has to take place fairly directionally, use is preferably made, however, of electro-optical effects, and more particularly, of charge carrier injection into the semiconductor materials.

A structure of a switching device based on a switchable mode converter will be described in more detail below only by way of example on the basis of one type of waveguide material, viz. InP, and one type of waveguide, viz. a ridge-type waveguide, with matching modifying means.

Figure 2:
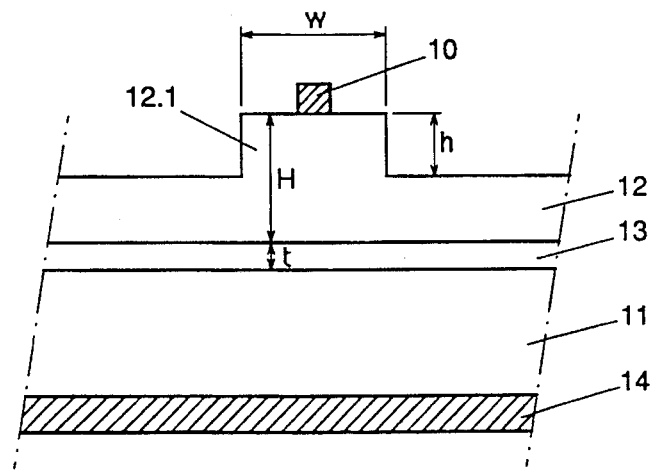
FIG. 2 shows a cross section of the switching device shown in FIG. 1.

FIG. 1 shows diagrammatically a plan view of an optical switching device according to the invention, while FIG. 2 shows diagrammatically a cross section of such a device. The device comprises, adjoining one another consecutively, a monomodal incoming waveguide a, a wave-guiding taper b from a monomodal to a bimodal waveguide, a 100% $TX_{00} \rightarrow TY_{01}$ mode converter c, a second wave-guiding taper d from a bimodal to a monomodal waveguide, and a monomodal outgoing waveguide e. The mode converter c has a central bimodal waveguide f in which, by means of constrictions having a length L which are also repeated periodically over a length L, a number of coupling surfaces, numbered 1, 2, --, N, is provided for effecting a wavelength-selective periodic coupling between the guided modes $TX_{00}$ and $TY_{01}$. Here both TX and TY stand for one of the polarizations TE or TM. For the sake of simplicity only, the constrictions have been chosen here as symmetrical and with the same length as the wider parts of the waveguide f situated between the constrictions g. Situated centrally above the bimodal waveguide f is a narrow elongated strip-type electrode 10 which preferably extends over all the coupling surfaces 1 to N inclusive, that is to say in the length direction of the waveguide f viewed from upstream of the first coupling surface 1 to past the last coupling surface N.

The entire waveguide structure from the incoming guide a to the outgoing guide e inclusive is of the type of a ridge-type waveguide, whose cross section is shown in FIG. 2. Situated between a substrate 11 and an upper layer 12, both made of InP, is a light-guiding layer 13 made of InGaAsP and having thickness t. The upper layer 12 has, locally over the entire length of the waveguide structure, a ridge-type elevation 12.1 having a fixed height h with a total height H, and having a width w which is different for the various adjoining waveguides a to e. Situated centrally on the ridge-type elevation of the bimodal waveguide f of the converter c is the strip-type electrode 10, while a laminar electrode 14 extends over the bottom of the substrate 11, at least underneath the bimodal waveguide f. A switchable current source can be connected to the electrodes 10 and 14 via supply and collecting conductors (not shown) in order to supply a current, by means of which charge carrier injection can be effected, as known, into the upper layer 12 at the position of the ridge-type elevation 12.1, as a consequence of which a change in the refractive index is effected. The operation of the switching device is as follows. With the current source switched off, no charge carrier injection takes place and the mode converter c therefore behaves as a passive device. If a zeroth-order guided mode light signal having a polarization TX and a wavelength for which the mode converter c is selective enters the bimodal waveguide f via the incoming waveguide a and the taper b under these conditions, said signal is completely converted in the converter into a $TY_{01}$ signal. Having arrived in the taper d, where the channel-type waveguide is narrowed down from a bimodal to a monomodal guide, said first-order guided mode signal is unable to propagate further in the guide but is scattered therein. If the current source is now switched on, charge carrier injection takes place into the light-guiding layer 12 underneath the electrode 10, more particularly into the ridge-type elevation 12.1 of the bimodal waveguide f. As a result, the fixed coupling length L provided geometrically by means of the periodic constrictions is no longer capable of effecting a positive interference in the consecutive coupling surfaces, as is necessary for mode conversion. In each coupling surface, the modes to be coupled get more and more out of phase. As the degree of charge carrier injection increases, an ever increasing "detuning" takes place, with the result that eventually conversion no longer takes place. The signal which has entered via the incoming guide a will now in fact pass through the switching device unaltered and leave via the outgoing guide e. Any other guided mode signals, likewise incoming via the incoming waveguide a and for which the mode converter c is not selective, will again leave the switching device via the outgoing waveguide e, in principle unaltered in both cases.

Instead of being a single strip-type electrode 10 which is situated centrally on the ridge-type elevation 12.1 and with which the mode field profile of the zeroth-order guided mode is essentially modified, the electrode 10 may also be of twin construction, with two coupled strips, which are situated essentially symmetrically with respect to the center and, preferably, near the edges of the ridge-type elevation 12.1. In such a design, essentially the mode field profile of the first-order guided mode is modified on energizing the electrodes.

The actual switchable mode converter according to the invention is formed by the mode converter c in combination with the matching modifying means, in this case the electrodes 10 and 14, to which a switchable current source can be connected.

EXAMPLE

The following values illustrate an on/off switch for a $TE_{00}$ signal for a wavelength of 1.5 µm with a structure as described by reference to FIGS. 1 and 2:
for the ridge-type waveguide structure
refractive index of InP, $n_1=3.1753$,
refractive index of InGaAsP, $n_2=3.4116$
t=0.473 µm, H=0.504 µm and h=0.2 µm.
This ridge-type waveguide structure can be produced in one etching step the width w being the sole variable parameter:
the incoming waveguide a must be monomodal for TE; therefore w=6.0 µm maximum;
the taper b must run from monomodal to bimodal, the bimodal channel having good guiding properties at least for the TM polarization; for this purpose, a width of w=8.5 µm is suitable, while approximately 1° is chosen as taper angle for the transition; the length of the taper is consequently approximately 200 µm;
a 100% $TE_{00} \rightarrow TM_{01}$ with N=11 coupling surfaces and a coupling length L=65 µm is chosen as mode converter c; in each constriction g, the width w=6 µm; the total length of the mode converter is approximately 710 µm;
the strip-type electrode 10 has a width of 3 µm; the remaining dimensions and the choice of material for the electrodes are in fact irrelevant for the operation of the device; usually a thickness is chosen of approximately 200 nm, with a layered structure of Ti (2–5 nm), Pt (2–5 nm) and Au;
for the second taper d from bimodal to monomodal, the chosen dimensions are equal to those of the first taper b;
the outgoing waveguide e must be monomodal for the polarization TM; this is achieved with a width of not more than 4.3 µm. The total length of this is somewhat more than 1 mm, which is appreciably shorter than that achievable with the known absorption switch.

Figure 3:
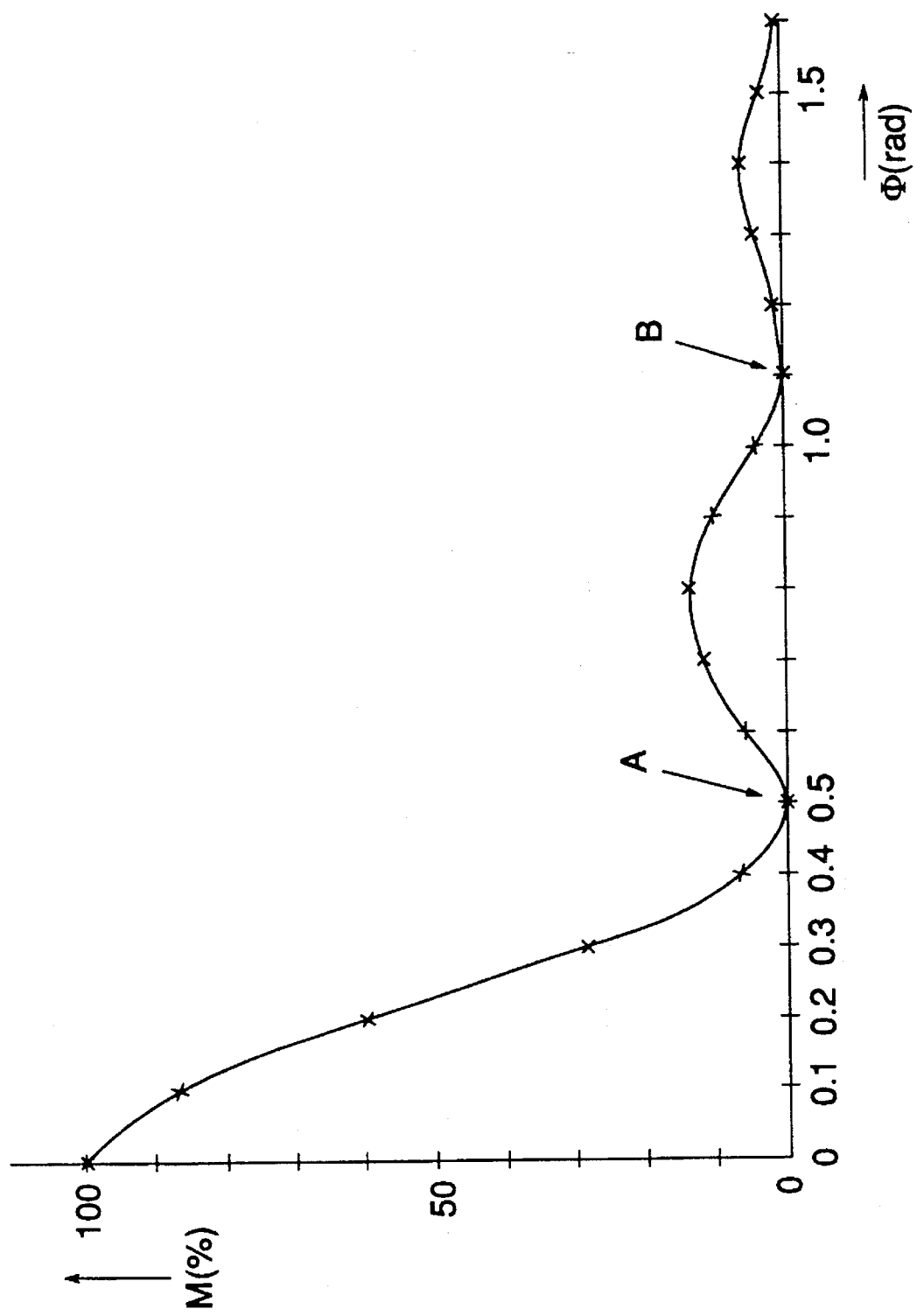
FIG. 3 shows, for a specific switching device as shown in FIG. 1, the degree of conversion as a function of a phase deviation between the guided modes to be coupled in consecutive coupling surfaces of a mode converter used in the switching device.

In FIG. 3, the degree of conversion M (vertically from 0 to 100%) is plotted for the switching device of the example as a function of the "detuning", i.e. the phase deviation $\Phi$ between the modes to be coupled in each coupling surface (horizontally in rad). For $\Phi=0$ rad, M=100%, that is to say complete conversion. For $\Phi=0.5$ rad, M≈0.01% (arrow A), that is to say the converted fraction is virtually zero. The current density associated with such a phase deviation is only 3 kA/cm², which is equivalent to a very low injection current of 65 mA. The associated attenuation is <0.5 dB. Something similar is the case for $\Phi=1.1$ rad (arrow B), a subsequent minimum in the degree of conversion, albeit at a somewhat higher injection current. An on/off switching of the conversion is therefore obtained in this example if the injection current is always set in such a way that, for a first current value, the phase deviation is $\Phi=0$ rad, that is to say the conversion is 100%, and for a second current value, the phase deviation $\Phi=0.5$ rad, and the conversion is therefore virtually zero. From the figure it is evident that virtually any degree of conversion between 0 and 100% can be produced by continuously regulating the phase deviation between 0 and 0.5 rad while continuously regulating the injection current by energizing the electrodes 10 and 14. Such devices are therefore also suitable for analog signal modulation.

In the example, the passive mode converter used in the switching device is designed for a specific selective conversion, which means that, if there is no injection current, there is, in principle, no phase deviation ($\Phi \approx 0$) for the mode for which the mode converter is selective. However, a mode converter can also be manufactured with a certain fixed phase deviation ($\Phi \neq 0$) in the absence of an injection current, that is to say, as it were, critically detuned, it being possible to obtain the desired degree of conversion (0–100%) by regulating the injection current.

A switching device described by reference to FIG. 1 is in fact an on/off switch for that fraction of a zeroth-order guided mode signal for which the mode converter is selective. If the taper d at the output side of the device is replaced by an asymmetrical Y junction h based on a monomodal branching of a bimodal waveguide, that is to say having two outgoing monomodal branches with different propagation constants, a propagation direction switch is obtained which is specific for that fraction for which the mode converter is selective. Such a 2×2 switch is produced if the taper b is also replaced at the input side by such a Y junction k.

A polarization-independent switching device can be produced if two switchable mode converters which are selective for different polarizations, whether or not separately switchable, are placed in series between tapers and/or asymmetric Y junctions.

I claim:

1. Optical switching device, comprising:
   a passive mode converter, provided with a bimodal channel type optical waveguide having a periodic mode field profile structure with a fixed period for converting a fraction of a first guided mode signal into a second guided mode signal, one guided mode of the first and second guided mode signals being a guided mode of a zeroth-order and another guided mode of the first and second guided mode signals being of a first-order, and
   switching means for switchably modifying mainly a propagation constant of only one of said first and second guided mode signals in the channel type optical waveguide.

2. Optical switching device according to claim 1, wherein:
   the bimodal waveguide is constructed as a channel-type waveguide in semiconductor material, and
   said switching means comprise a first electrode and a second electrode for effecting charge carrier injection into the semiconductor material of said channel-type waveguide, the first electrode being of a strip-type and extending in the longitudinal direction above said channel-type waveguide.

3. Optical switching device according to claim 2, wherein the first electrode comprises a strip-type element centrally situated in the longitudinal direction above said channel-type waveguide.

4. Optical switching device according to claim 3, further comprising:
   a first wave-guiding transition section from a first incoming monomodal waveguide to the bimodal waveguide of the mode converter, and
   a second wave-guiding transition section from the bimodal waveguide of the mode converter to a first outgoing monomodal waveguide.

5. Optical switching device according to claim 3, wherein said mode converter is a 100% converter.

6. Optical switching device according to claim 5, further comprising:
   a first wave-guiding transition section from a first incoming monomodal waveguide to the bimodal waveguide of the mode converter, and
   a second wave-guiding transition section from the bimodal waveguide of the mode converter to a first outgoing monomodal waveguide.

7. Optical switching device according to claim 2, wherein the first electrode comprises two strip-type elements situated in the longitudinal direction essentially symmetrically with respect to a center of, and above, said channel-type waveguide.

8. Optical switching device according to claim 7, further comprising:
   a first wave-guiding transition section from a first incoming monomodal waveguide to the bimodal waveguide of the mode converter, and
   a second wave-guiding transition section from the bimodal waveguide of the mode converter to a first outgoing monomodal waveguide.

9. Optical switching device according to claim 7, wherein said mode converter is a 100% converter.

10. Optical switching device according to claim 9, further comprising:
    a first wave-guiding transition section from a first incoming monomodal waveguide to the bimodal waveguide of the mode converter, and
    a second wave-guiding transition section from the bimodal waveguide of the mode converter to a first outgoing monomodal waveguide.

11. Optical switching device according to claim 1, further comprising:
    a first wave-guiding transition section from a first incoming monomodal waveguide to the bimodal waveguide of the mode converter, and
    a second wave-guiding transition section from the bimodal waveguide of the mode converter to a first outgoing monomodal waveguide.

12. Optical switching device according to claim 11, wherein the first transition section and second transition section are single wave-guiding tapers.

13. Optical switching device according to claim 11, wherein the first and second transition sections are asymmetrical Y junctions.

14. Optical switching device according to claim 11, wherein the first transition section is a single wave-guiding taper and the second transition section is an asymmetrical Y junction.

15. Optical switching device according to claim 2, wherein said mode converter is a 100% converter.

16. Optical switching device according to claim 15, further comprising:
    a first wave-guiding transition section from a first incoming monomodal waveguide to the bimodal waveguide of the mode converter, and
    a second wave-guiding transition section from the bimodal waveguide of the mode converter to a first outgoing monomodal waveguide.

17. Optical switching device according to claim 2, further comprising:
- a first wave-guiding transition section from a first incoming monomodal waveguide to the bimodal waveguide of the mode converter, and
- a second wave-guiding transition section from the bimodal waveguide of the mode converter to a first outgoing monomodal waveguide.

18. Optical switching device according to claim 1, wherein said mode converter is a 100% converter.

19. Optical switching device according to claim 18, further comprising:
- a first wave-guiding transition section from a first incoming monomodal waveguide to the bimodal waveguide of the mode converter, and
- a second wave-guiding transition section from the bimodal waveguide of the mode converter to a first outgoing monomodal waveguide.

* * * * *